(12) United States Patent
Kim et al.

(10) Patent No.: US 9,343,326 B2
(45) Date of Patent: May 17, 2016

(54) CMP SLURRY COMPOSITION FOR POLISHING AN ORGANIC LAYER AND METHOD OF FORMING A SEMICONDUCTOR DEVICE USING THE SAME

(71) Applicants: Yun-Jeong Kim, Suwon-si (KR); Sang-Kyun Kim, Yongin-si (KR); Kwang-Bok Kim, Incheon (KR); Ye-Hwan Kim, Seoul (KR); Jung-Sik Choi, Seongnam-si (KR); Choong-Ho Han, Seoul (KR); Gi-Sik Hong, Hwaseong-si (KR)

(72) Inventors: Yun-Jeong Kim, Suwon-si (KR); Sang-Kyun Kim, Yongin-si (KR); Kwang-Bok Kim, Incheon (KR); Ye-Hwan Kim, Seoul (KR); Jung-Sik Choi, Seongnam-si (KR); Choong-Ho Han, Seoul (KR); Gi-Sik Hong, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/825,846

(22) Filed: Aug. 13, 2015

(65) Prior Publication Data

US 2015/0348798 A1    Dec. 3, 2015

Related U.S. Application Data

(63) Continuation of application No. 14/311,857, filed on Jun. 23, 2014, now abandoned.

(30) Foreign Application Priority Data

Jul. 17, 2013  (KR) .......................... 10-2013-0084279
Jan. 16, 2014  (KR) .......................... 10-2014-0005583
May 12, 2014  (KR) .......................... 10-2014-0056408

(51) Int. Cl.
*H01L 21/302* (2006.01)
*H01L 21/3105* (2006.01)
(Continued)

(52) U.S. Cl.
CPC ........ *H01L 21/31058* (2013.01); *C09K 3/1463* (2013.01); *H01L 21/0337* (2013.01);
(Continued)

(58) Field of Classification Search
CPC ..................... H01L 21/30625; H01L 21/3212; H01L 21/31051; C09G 1/02; C09G 1/00
USPC ................................. 438/692, 693, 697, 700
See application file for complete search history.

(56) References Cited

U.S. PATENT DOCUMENTS 5,981,394 A    11/1999   Ohashi et al.
7,531,449 B2    5/2009   Park et al.
(Continued)

FOREIGN PATENT DOCUMENTS

JP    2004363191 A    12/2004
JP    2010041027 A    2/2010
(Continued)

*Primary Examiner* — Binh X Tran
(74) *Attorney, Agent, or Firm* — Harness, Dickey & Pierce, P.L.C.

(57) ABSTRACT

A chemical mechanical polishing (CMP) slurry composition for polishing an organic layer and a method of forming a semiconductor device using the same are disclosed. The CMP slurry composition may include from 0.001% to 5% by weight of oxide-polishing particles; from 0.1% to 5% by weight of an oxidant; from 0% to 5% by weight of a polishing regulator; from 0% to 3% by weight of a surfactant; from 0% to 3% by weight of a pH regulator; and from 79% to 99.889% by weight of deionized water. The use of the CMP slurry composition makes it possible to allow a silicon-free organic layer to be polished with a selectivity higher than 6:1 with respect to an oxide layer.

7 Claims, 16 Drawing Sheets

(51) Int. Cl.
*C09K 3/14* (2006.01)
*H01L 21/033* (2006.01)
*H01L 21/311* (2006.01)
*H01L 21/3213* (2006.01)
*H01L 27/115* (2006.01)

(52) U.S. Cl.
CPC ...... *H01L21/0338* (2013.01); *H01L 21/31055* (2013.01); *H01L 21/31144* (2013.01); *H01L 21/32139* (2013.01); *H01L 27/11582* (2013.01)

(56) References Cited

U.S. PATENT DOCUMENTS

| | | |
|---|---|---|
| 8,119,517 B2 | 2/2012 | Shida et al. |
| 2002/0001914 A1* | 1/2002 | Lee ............... H01L 21/3212 438/401 |
| 2002/0016060 A1* | 2/2002 | Matsuzawa ......... C01F 17/0043 438/633 |
| 2005/0202670 A1* | 9/2005 | Shinmaru ............... C09G 1/02 438/626 |
| 2007/0000872 A1* | 1/2007 | Matsui ............... B24B 37/044 216/88 |
| 2007/0043230 A1 | 2/2007 | Jha et al. |
| 2008/0113511 A1 | 5/2008 | Park et al. |
| 2009/0068841 A1* | 3/2009 | Matsui ................. C09G 1/02 438/693 |
| 2009/0124076 A1* | 5/2009 | Matsui ................. C09G 1/02 438/637 |
| 2009/0239373 A1 | 9/2009 | Shida et al. |
| 2011/0045741 A1 | 2/2011 | Ahn et al. |
| 2011/0318929 A1 | 12/2011 | Mishima et al. |
| 2013/0032572 A1* | 2/2013 | Park ................... C09K 3/1463 216/53 |

FOREIGN PATENT DOCUMENTS

| | | |
|---|---|---|
| JP | 2010129941 A | 6/2010 |
| KR | 20090026984 A | 3/2009 |

\* cited by examiner

CMP SLURRY COMPOSITION FOR POLISHING AN ORGANIC LAYER AND METHOD OF FORMING A SEMICONDUCTOR DEVICE USING THE SAME

CROSS-REFERENCE TO RELATED APPLICATIONS

This application is a continuation of U.S. application Ser. No. 14/311,857, filed on Jun. 23, 2014, now abandoned, which claims priority from Korean Patent Application No. 10-2013-0084279, filed on Jul. 17, 2013, in the Korean Intellectual Property Office (KIPO), Korean Patent Application No. 10-2014-0005583, filed on Jan. 16, 2014, and Korean Patent Application No. 10-2014-0056408, filed on May 12, 2014, in the KIPO, the entire contents of both of which are incorporated herein by reference.

BACKGROUND

Example embodiments of the inventive concept relate to a chemical mechanical polishing (CMP) slurry composition for polishing a layer and method of forming a semiconductor device using the same.

As an integration density of semiconductor devices increases, there is an increasing demand for fine patterns and multi-layered circuitry. To meet such a demand, it may be helpful to use layers having etch rates that are different from each other. For example, an organic layer containing a hydrocarbon compound has a good etch selectivity with respect to a silicon-containing layer, and thus, the organic layer containing the hydrocarbon compound can be used as a mask layer or as a sacrificial layer. Etch selectivity is the ratio of the etch rates between two different materials, in this case between the organic layer and the silicon-containing layer. In a process of fabricating a semiconductor device, there may be a need to remove the organic layer using a CMP process. However, conventional CMP slurries have not been used to effectively polish organic layers.

SUMMARY

Example embodiments of the inventive concept provide a CMP slurry composition capable of effectively polishing an organic layer. For example, the CMP slurry composition is usable in the manufacture of V-NAND flash memory devices or for polishing a hydrocarbon layer using double patterning technology (DPT).

Other example embodiments of the inventive concept provide a process of fabricating a semiconductor using the slurry composition.

According to example embodiments of the inventive concept, a chemical mechanical polishing (CMP) slurry composition for polishing a low silicon layer such as, for example, an organic layer or a silicon-free organic layer, may include from about 0.001% to about 5% by weight of oxide-polishing particles; from about 0.1% to about 5% by weight of an oxidant; from about 0% to about 5% by weight of a polishing regulator; from about 0% to about 3% by weight of a surfactant; from about 0% to about 3% by weight of a pH regulator; and from about 79% to about 99.889% by weight of deionized water.

In example embodiments, the polishing particle may include at least one of silica ($SiO_2$), ceria ($CeO_2$), and alumina ($Al_2O_3$).

In example embodiments, the polishing particle has a grain size ranging from about 30 nm to about 120 nm.

In example embodiments, the oxidant may include at least one of hydrogen peroxide, superoxide, dioxygenyl, ozone, ozonide, peroxide, fluorine, chlorine, chlorite, chlorate, perchlorate, halogen compounds, nitric acid, nitrate, hypochlorite, hypohalite, chromium trioxide, pyridinium chlorochromate, chromate, dichromate, chromium compound, potassium permanganate, permanganate, sodium perborate, nitrous oxide, 2,2'-dipyridisulfide, lead dioxide ($PbO_2$), manganese dioxide ($MnO_2$), copper oxide (CuO), ferric trichloride ($FeCl_3$), (perchloric acid, $HClO_4$), ferric nitrate (Fe $(NO)_3$), sulfate and potassium persulfate ($K_2S_2O_8$).

In example embodiments, the polishing regulator may include at least one of organic acid, inorganic acid, nitric acid, nitrate, sulfuric acid, peroxydisulfuric acid, peroxymonosulfuric acid, sulfonic acid, acetic acid, citric acid, formic acid, gluconic acid, lactic acid, oxalic acid, tartaric acid, carboxylic acid, chloric acid, chlorous acid, hypochlorous acid, perchloric acid, halogen oxoacid, ascorbic acid, vinylogous carboxylic acid, amino acid, histidine, glycine, arginine, hydrochloric acid, fluoric acid and phosphoric acid.

In example embodiments, the surfactant may be anionic or non-ionic. For example, the surfactant may include at least one of lauryl myristyl alcohol series, methyl-oxirane polymer series, whose hydrophile lipophile balance (HLB) may be 12 or higher, ethylenediamine, ethoxylated and propoxylated alcohol series, 2-methyloxirane, oxirane series, polyethylene glycol, and polysorbate series.

The surfactant may further include at least one of benzalkonium chloride, alkyl benzene sulfonate, phemerol chloride, ammonium lauryl sulfate, sodium lauryl ether sulfate, sodium myreth sulfate, dioctyl sodium sulfosuccinate, perfluorooctanesulfonate, perfluorobutanesulfonate, linear alkylbenzene sulfonate, sodium stearate, sodium lauroyl sarcosinate, cetyl trimethylammonium bromide, cetyl trimethylammonium chloride, perfluorononanoate, perfluorooctanoate, octenidine dihydrochloride, 5-bromo-5-nitro-1, 3-dioxane, dimethyldioctadecylammonium chloride, cetrimonium bromide, dioctadecyldimethylammonium bromide, octaethylene glycol monododecyl ether, glyceryl laurate, and polyethoxylated tallow amine.

In example embodiments, the pH regulator may include at least one acidic material from poly acrylic acid, carboxylic acid, nitric acid, sulfuric acid and sulfonic acid or at least one basic material from potassium hydroxide, sodium hydroxide, ammonia water, tetramethylammonium hydroxide, tetraethylammonium hydroxide, and tetrabuthylammonium hydroxide.

According to example embodiments of the inventive concept, a method of fabricating a semiconductor device may include forming a first structure having a first recess region on a substrate, forming a low silicon layer such as, for example, an organic layer or a silicon-free organic layer on the first structure to fill the first recess region, and performing a CMP process using the CMP slurry composition on the organic layer to expose a top surface of the first structure. The composition may have a pH in the range of 2.0~5.0.

In example embodiments, the first recess region may be formed to include a first hole exposing the substrate, and the method may further include, after performing the CMP process on the organic layer, forming a second structure including a second hole exposing a top surface of the organic layer on the first structure, removing the organic layer through the second hole, forming an active pillar covering at least sidewalls of the first and second holes, and forming a conductive line in the first and second structures.

In example embodiments, each of the first and second structures may be formed to include a plurality of insulating layers and a plurality of sacrificial layers that may be alternatively stacked on the substrate, and the forming of the conductive line in the first and second structures may include selectively removing the sacrificial layers to form an inter-layered empty region, and forming the conductive line in the inter-layered empty region.

In example embodiments, the first structure may include etch-target layer provided on the substrate, a plurality of line-shaped first mask patterns provided parallel to each other on the etch-target layer, and a second mask layer conformally covering side and top surfaces of the first mask patterns, the second mask layer may have the first recess region between the first mask patterns, and exposing the top surface of the first structure may be performed to expose a top surface of the second mask layer.

In example embodiments, a space between the first mask patterns may be about three times a thickness of the second mask layer, and the organic layer may be disposed between the first mask patterns.

In example embodiments, the method may further include an anisotropic etching process to remove the exposed second mask layer and form a second mask pattern below the organic layer.

In example embodiments, an oxide layer may be provided on the first structure, and the CMP slurry composition may be configured to allow the organic layer to be polished with respect to the oxide layer with a selectivity higher than about 6:1.

In example embodiments, the removing of the portion of the organic layer may be performed not to expose a top surface of the first structure.

According to at least one example embodiment, a chemical mechanical polishing (CMP) slurry composition includes a first concentration of oxide-polishing particles, a second concentration of an oxidant, a third concentration of a polishing regulator, a fourth concentration of a surfactant, a fifth concentration of a pH regulator, and a sixth concentration of deionized water, the slurry composition being configured to etch a first type of layer at a different rate than a second type of layer. For example, the first type of layer is an oxide layer and the second type of layer comprises an organic layer, an etch selectivity of the oxide layer with respect to the organic layer is in a range between 6:1 and 430:1, and the organic layer is a mask layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
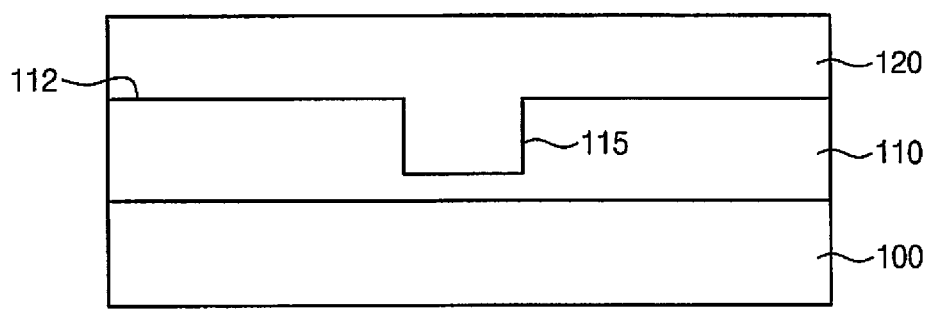
FIGS. 1, 2A, and 2B are sectional views illustrating a process of fabricating a semiconductor device, according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these example embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "on," "connected" or "coupled" to another element, it can be directly on, directly connected or coupled to the other element or intervening elements may be present. In contrast, when an element is referred to as being "directly on," "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In example embodiments, a fabrication process to be described below may be applied to a nonvolatile memory device (for example, having a three-dimensional V-NAND flash memory structure or for polishing a hydrocarbon layer using double patterning technology (DPT)).

Figure 2A:
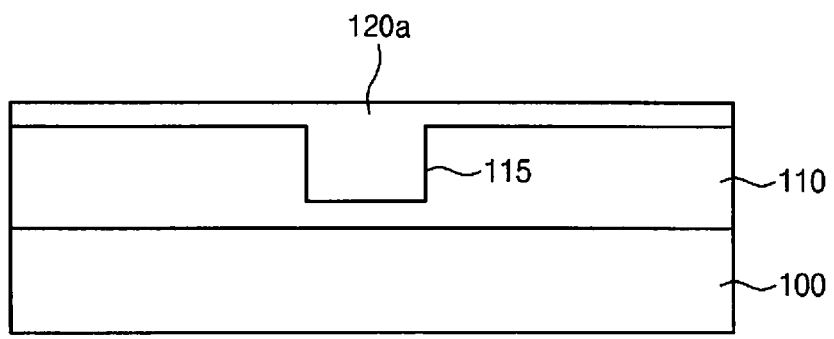
Figure 2B:
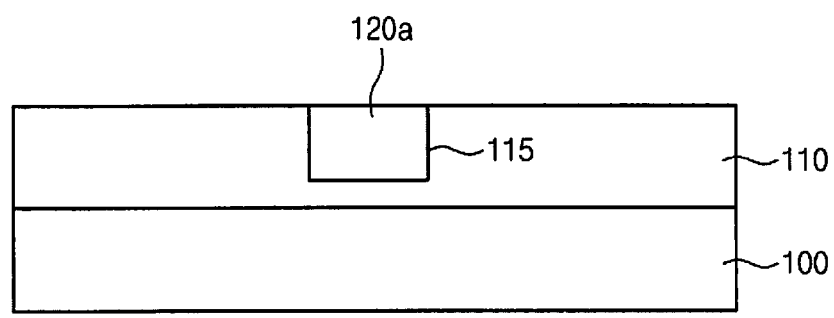

FIGS. 1, 2A, and 2B are sectional views illustrating a process of fabricating a semiconductor device, according to example embodiments of the inventive concept.

Referring to FIG. 1, a structure 110 may be formed on a substrate 100 to include a recessed region 115. The structure 110 may include a top portion 112 made of oxide. An organic layer 120 may be formed on the structure 110. In an example embodiment, the organic layer 120 may be referred to as a spin-on-carbon layer or a spin-on-hard mask layer. The organic layer 120 may also be a low silicon layer such as, for example, an organic layer or a silicon-free organic layer. The formation of the organic layer 120 may include a spin-coating step and a drying or baking step. The organic layer 120 may be formed to fill the recessed region 115.

Referring to FIGS. 2A and 2B, a polishing process may be performed to polish the organic layer 120, according to at least one example embodiment. For example, the process may be performed to remove a portion of the organic layer 120 from a top surface of the structure 110. In example embodiments, the polishing process may be a chemical-mechanical polishing (CMP) process. In an example embodiment, as shown in FIG. 2A, an organic pattern 120a may be formed on the structure 110 to have a predetermined thickness. Alternatively, as shown in FIG. 2B, the polishing process may be performed in such a way that the top surface of the structure 110 is exposed and the organic pattern 120a remains in the recessed region 115. In example embodiments, the CMP process may be performed using a CMP slurry composition including, for example, from about 0.001% to about 5% by weight of oxide-polishing particles; from about 0.1% to about 5% by weight of an oxidant; from 0% to about 5% by weight of a polishing regulator; from 0% to about 3% by weight of a surfactant; from 0% to about 3% by weight of a pH regulator; and from about 79% to about 99.889% by weight of deionized water.

The polishing particle may include at least one of silica ($SiO_2$), ceria ($CeO_2$), and alumina ($Al_2O_3$). The polishing particle may be provided to have a grain size ranging from about 10 nm to about 100 nm and preferably ranging from about 30 nm to about 120 nm.

The oxidant may induce oxidation of the organic layer, which allows to obtain a desired polishing rate. The oxidant may include at least one of peroxide series (e.g., hydrogen peroxide, superoxide, dioxygenyl, ozone, and ozonide), halogen series (e.g., fluorine and chlorine), halogen compound series (e.g., chlorite, chlorate and perchlorate), nitrate series (e.g., nitric acid), hypochlorite or hypohalite series (e.g., home cleaner), chromium compound series (e.g., chromium trioxide, pyridinium chlorochromate, chromate, and dichromate), permanganate series (e.g., potassium permanganate), a metal compound having a high oxidation number (e.g., lead dioxide($PbO_2$), manganese dioxide($MnO_2$), copper oxide (CuO), ferric trichloride($FeCl_3$)), sulfate (e.g., potassium persulfate($K_2S_2O_8$)), perchloric acid ($HClO_4$), ferric nitrate (Fe$(NO)_3$), sodium perborate, nitrous oxide, and 2,2'-dipyridisulfide.

In example embodiments, the chlorite or the chlorate series may be used as the oxidant.

The polishing regulator may cut carbon chains in the organic layer. Organic or inorganic acid may be used as the polishing regulator. For example, the polishing regulator may include at least one of nitrate series (e.g., nitric acid), sulfonic series (e.g., sulfuric acid, peroxydisulfuric acid, and peroxymonosulfuric acid), carboxylic acid series (e.g., acetic acid, citric acid, formic acid, gluconic acid, lactic acid, oxalic acid, and tartaric acid), halogen oxoacid series (e.g., chloric acid, chlorous acid, hypochlorous acid, and perchloric acid), vinylogous carboxylic acid series (e.g., ascorbic acid), amino acid series (e.g., histidine, glycine, and arginine) and inorganic acid (e.g., hydrochloric acid, fluoric acid and phosphoric acid). In example embodiments, the carboxylic acid series may be used as the polishing regulator.

The surfactant may improve wettability on a surface of the organic layer of the CMP slurry composition and thereby increase the polishing rate. The surfactant may be anionic or non-ionic. For example, the surfactant may include at least one of lauryl myristyl alcohol series, methyl-oxirane polymer series, whose hydrophile lipophile balance (HLB) is 12 or higher, ethylenediamine, C1-16 ethoxylated and propoxylated alcohol series, 2-methyloxirane, oxirane series, polyethylene glycol, or polysorbate series. Furthermore, the surfactant may include at least one of benzalkonium chloride, alkyl benzene sulfonate, phemerol chloride, ammonium lauryl sulfate, sodium lauryl ether sulfate, sodium myreth sulfate, dioctyl sodium sulfosuccinate, perfluorooctanesulfonate, perfluorobutanesulfonate, linear alkylbenzene sulfonate, sodium stearate, sodium lauroyl sarcosinate, cetyl trimethylammonium bromide, cetyl trimethylammonium chloride, perfluorononanoate, perfluorooctanoate, octenidine di hydrochloride, 5-bromo-5-nitro-1,3-dioxane, dimethyldioctadecylammonium chloride, cetrimonium bromide, dioctadecyldimethylammonium bromide, octaethylene glycol monododecyl ether, glyceryl laurate, and polyethoxylated tallow amine.

The pH regulator may control pH of the CMP slurry composition. Since the polishing regulator includes acid, it may also serve as a pH regulator. The pH regulator may be acid or basic. For example, the pH regulator may include acid materials, such as poly acrylic acid, carboxylic acid, nitric acid, sulfuric acid and sulfonic acid, or basic materials, such as potassium hydroxide, sodium hydroxide, ammonia water, tetramethylammonium hydroxide, tetraethylammonium hydroxide, and tetrabuthylammonium hydroxide. The CMP slurry composition preferably may have a pH in the range 2.0~5.0.

By using the CMP slurry composition, it may be possible to efficiently polish an organic layer such as organic layer 120.

The CMP slurry composition according to example embodiments will be described with reference to the experimental examples below.

Experimental Example 1

The Type of Oxidant

According to at various example embodiments, eight wafers are prepared. Silicon-free organic layers are formed on four wafers, and TEOS layers, one of silicon oxide series, are formed on the remaining four wafers. CMP slurry compositions serving as polishing agent are prepared to contain about 1% by weight of silica, about 98% by weight of deionized water, and about 1% by weight of an oxidant. The type of oxidant contained in the CMP slurry compositions is changed to peroxide series, chlorate, nitrate series, and compounds having a high oxidation number. In an example embodiment, hydrogen peroxide is used as one of the peroxide series. Perchloric acid($HClO_4$) is used as one of the chlorate series. Ferric nitrate($Fe(NO)_3$) is used as one of the nitrate series. The compounds having a high oxidation number mean a compound of metal such as lead dioxide($PbO_2$), manganese dioxide($MnO_2$), copper oxide($CuO$), ferric trichloride ($FeCl_3$). In an example embodiment, ferric trichloride($FeCl_3$) is used as one of the compounds having a high oxidation number. Mean grain size of the silica is about 60 nm. CMP processes are performed on the eight wafers using respective CMP slurry compositions. The following Table 1 shows experiment results (e.g., polishing rate and selectivity) measured after the CMP processes.

TABLE 1

| | | Polishing Rate (Å/min) | | |
|---|---|---|---|---|
| | Type of Oxidant | Organic Layer (A) | TEOS (B) | Selectivity (A/B) |
| 1 | Peroxide series | 1250 | 115 | 10.9 |
| 2 | Chlorate series | 1530 | 95 | 16.1 |
| 3 | Nitrate series | 920 | 89 | 10.3 |
| 4 | Compounds having a high oxidation number | 870 | 112 | 7.8 |

According to Table 1, polishing rate and selectivity are the highest for the chlorate series. However, the selectivity is higher than 6:1 for other oxidants (e.g., peroxide or nitrate series), which illustrates the fact that other oxidants can also be effectively used as antioxidants in the polishing process of an organic layer.

Experimental Example 2

Polishing Particle and Oxidant Content

In the experimental example 2, according to various example embodiments, polishing properties according to contents of the chlorate series and the silica are examined, when the chlorate series and the silica are used as the oxidant and the polishing particles, respectively. Firstly, 34 wafers are prepared. Silicon-free organic layers are formed on 17 wafers, and TEOS layers, one of silicon oxide series, are formed on the remaining 17 wafers. As shown in Table 2 below, the chlorate series having concentrations of 0.1 wt %-3.0 wt % and the silica having concentrations of 0.01 wt %-1.0 wt % are used as the oxidant and polishing particle of the CMP slurry composition, respectively. After performing the CMP process on the wafers, polishing properties are measured. Table 2 shows the measurement results. In an example embodiment, perchloric acid($HClO_4$) is used as one of the chlorate series. The mean grain size of the silica is about 60 nm.

TABLE 2

| | Oxidant | | Polishing Rate (Å/min) | | |
|---|---|---|---|---|---|
| | Content (wt %) | Polishing Particle Content (wt %) | Organic Layer (A) | PE-TEOS (B) | Selectivity (A/B) |
| 1 | 1.2 | 0.4 | 1650 | 45 | 36.7 |
| 2 | 1.0 | 0.4 | 1620 | 40 | 40.5 |
| 3 | 0.7 | 0.4 | 1510 | 42 | 35.9 |
| 4 | 0.5 | 0.4 | 1400 | 40 | 35.0 |
| 5 | 1.0 | 0.7 | 1630 | 89 | 18.3 |
| 6 | 1.0 | 0.5 | 1620 | 62 | 26.1 |
| 7 | 1.0 | 0.3 | 1590 | 42 | 37.8 |

TABLE 2-continued

| | Oxidant | | Polishing Rate (Å/min) | | |
|---|---|---|---|---|---|
| | Content (wt %) | Polishing Particle Content (wt %) | Organic Layer (A) | PE-TEOS (B) | Selectivity (A/B) |
| 8 | 0.3 | 1.0 | 1158 | 121 | 9.6 |
| 9 | 0.2 | 1.0 | 941 | 124 | 7.6 |
| 10 | 0.1 | 1.0 | 804 | 129 | 6.2 |
| 11 | 3 | 0.01 | 1987 | 5 | 397.4 |
| 12 | 3 | 0.05 | 2100 | 6 | 350 |
| 13 | 3 | 0.1 | 2230 | 28 | 79.6 |
| 14 | 3 | 0.2 | 2480 | 48 | 51.7 |
| 15 | 3 | 0.5 | 2670 | 77 | 34.7 |
| 16 | 1 | 0.05 | 1505 | 8 | 188.1 |
| 17 | 1 | 0.1 | 1600 | 31 | 51.6 |

According to Table 2, the highest etch selectivity of 397.4 is obtained when the chlorate series had an oxidant content of 3 wt %, and the silica polishing particle had a concentration of 0.01 wt %. Furthermore, other combinations of concentrations of oxidant and polishing particles provided etch selectivities higher than 6, which illustrate the fact that the other combinations can also be effectively used for a polishing process of an organic layer.

Experimental Example 3-1

The Type of Polishing Regulator

In the experimental example 3-1, polishing properties according to the type and content of the polishing regulator are examined, when 1.0 wt % chlorate series and 0.4 wt % silica are used as the oxidant and the polishing particles of the CMP slurry composition. Firstly, eighteen wafers are prepared. Silicon-free organic layers are formed on nine wafers, and PE-TEOS layers, one of silicon oxide series, are formed on the remaining nine wafers. As shown in Table 3 below, the carboxylic acid having contents of 0.1 wt %-1.0 wt % are used as the polishing regulator or sulfonic acid, amino acid, inorganic acid, and nitric acid are used in place of the carboxylic acid. After performing the CMP process to the wafers, polishing properties are measured. Table 3 shows the measurement results. In an example embodiment, perchloric acid (HClO$_4$) is used as one of the chlorate series. Formic acid is used as one of the carboxylic acid. Histidine is used as one of the amino acids. Hydrochloric acid is used as one of the inorganic acid. Mean grain size of the silica is about 60 nm.

TABLE 3

| | Polishing regulator | | Polishing Rate (Å/min) | | |
|---|---|---|---|---|---|
| | Material | Content (wt %) | Organic Layer (A) | PE-TEOS (B) | Selectivity (A/B) |
| 1 | Carboxylic acid | 0.5 | 2010 | 48 | 41.9 |
| 2 | Carboxylic acid | 0.3 | 1990 | 42 | 47.4 |
| 3 | Carboxylic acid | 0.1 | 1820 | 41 | 44.4 |
| 4 | Carboxylic acid | 0.7 | 2580 | 45 | 57.3 |
| 5 | Carboxylic acid | 1.0 | 3340 | 42 | 79.5 |
| 6 | Sulfonic acid | 0.3 | 1800 | 47 | 38.3 |
| 7 | Amino acid | 0.3 | 1710 | 45 | 38.0 |
| 8 | Inorganic acid | 0.3 | 1690 | 43 | 39.3 |
| 9 | Nitric acid | 0.3 | 1720 | 43 | 40.0 |

According to Table 3, the highest selectivity of 79.5 is obtained when the CMP slurry composition is formed to contain 1.0 wt % of chlorate-series for the oxidant, 0.4 wt % of silica for the polishing particles, 1.0 wt % of carboxylic acid for the polishing regulator, and deionized water being the remaining content. Furthermore, with respect to the other types of polishing regulators, the selectivity is higher than 38, which illustrates the fact that the other types of polishing regulators can be effectively used for the polishing process of an organic layer.

Experimental Example 3-2

The Type of Polishing Regulator

In the experimental example 3-2, polishing properties according to the type and content of the polishing regulator are examined, when 1.0 wt % of chlorate series and 0.2 wt % of silica are used as the oxidant and the polishing particles of the CMP slurry composition, respectively. Firstly, six wafers are prepared. Silicon-free organic layers are formed on three wafers, and PE-TEOS layers, one of silicon oxide series, are formed on the remaining three wafers. As shown in Table 4, carboxylic acids having the contents of 0.7 wt %, 1.0 wt %, and 1.3 wt % are used as the polishing regulator. After performing the CMP process to the wafers, polishing properties are measured. Table 4 shows the measurement results. In an example embodiment, perchloric acid(HClO$_4$) is used as one of the chlorate series. Formic acid is used as one of the carboxylic acid. Mean grain size of the silica is about 60 nm.

TABLE 4

| | Polishing regulator | | Polishing Rate (Å/min) | | |
|---|---|---|---|---|---|
| | Material | Content (wt %) | Organic Layer (A) | PE-TEOS (B) | Selectivity (A/B) |
| 1 | carboxylic acid | 0.7 | 2600 | 24 | 108.3 |
| 2 | carboxylic acid | 1.0 | 3500 | 22 | 159.1 |
| 3 | carboxylic acid | 1.3 | 4410 | 21 | 210.0 |

According to Table 4, substantially high selectivities of 108.3-210.0 are obtained when 1.0 wt % of chlorate-based oxidant, 0.2 wt % of silica for the polishing particles, 0.7-1.3 wt % of carboxylic acids for the polishing regulator are used.

Experimental Example 4

The Type of Surfactant

In the experimental example 4, polishing properties according to the type of the surfactant are examined, when 1.0 wt % of the oxidant of chlorate series, 0.4 wt % of the polishing particles of silica, and 0.3 wt % of carboxylic acid are used for the CMP slurry composition. In the experimental example 4, cationic, anionic, and non-ionic surfactants are added in the CMP slurry composition. Firstly, six wafers are prepared. Silicon-free organic layers are formed on three wafers, and PE-TEOS layers, one of silicon oxide series, are formed on the remaining three wafers. Next, CMP slurry compositions are formed to contain surfactants that are different from each other, as described above. The contents of the added surfactants are 0.5 wt % relative to the total weight of the composition. CMP processes are performed to the wafers using the CMP slurry compositions, respectively. The following Table 5 shows experimental results measured after the CMP processes. In an example embodiment, perchloric acid(HClO$_4$) is used as one of the chlorate series. Formic acid is used as one of the carboxylic acid. Histidine is used as one of the amino acid. Hydrochloric acid is used as one of the inorganic acid. Mean grain size of the silica is about 60 nm. Benzalkonium chloride is used as one of the cationic surfactants. Alkyl benzene sulfonate is used as one of the anionic surfactants. Polyethylene glycol is used as one of the non-ionic surfactants.

TABLE 5

| | Surfactant Type | Surfactant content (wt %) | Selectivity (organic layer/PETEOS) |
|---|---|---|---|
| 1 | Cationic | 0.5 | 56 |
| 2 | Anionic | 0.5 | 73 |
| 3 | Non-ionic | 0.5 | 102 |

According to Table 5, the highest selectivity of 102 is obtained, when the non-ionic surfactant is added. Regardless of the type of the surfactant, a high selectivity of 56 or higher is obtained by merely adding a surfactant. The non-ionic surfactant produced the highest selectivity, and the second highest selectivity is produced by the anionic surfactant at a selectivity of 73. Further, a peeling phenomenon on a surface of the organic layer is significantly improved when the surfactant is added with respect to when the surfactant is not added. The presence of the surfactant may make it possible to improve wettability of the CMP composition on a surface of the organic layer. By virtue to the improved wettability of the CMP composition, the polishing process may be performed on the surface with increased uniformity. The improvement of the peeling phenomenon may result from the improved wettability of the CMP composition.

Experimental Example 5-1

In the experimental example 5-1, polishing selectivities are examined by varying pH of the CMP composition. First, silica having a grain size of about 60 nm is added in the composition with a concentration of about 0.5 wt. %, and perchloric acid($HClO_4$) is subsequently added as one of the oxidants with a concentration of about 1.0 wt. %, thereby forming 8 composition samples with a pH of about 2.1. pH regulators may then be added into 7 composition samples out of the total 8 composition samples, respectively, with a concentration less than 3 wt. %. In order to decrease the pH, nitric acid is added as a pH regulator into two composition samples, thereby decreasing pH of the two composition samples to 1.8 and 2.0, respectively. In order to increase pH, potassium hydroxide is added as a pH regulator into five composition samples, thereby increasing pH of the five composition samples to 2.2, 2.4, 2.6, 2.8, 3.0, respectively. CMP processes are performed to organic layers and TEOS layers using the 8 CMP slurry composition samples, respectively. The following Table 6 shows experimental results measured after the CMP processes.

TABLE 6

| | Composition pH | Polishing Rate (Å/min) | | Selectivity (A/B) | polishing particle stability |
|---|---|---|---|---|---|
| | | Organic Layer (A) | TEOS (B) | | |
| 1 | 1.8 | 1403 | 55 | 25.5 | bad |
| 2 | 2.0 | 1470 | 57 | 25.8 | bad |
| 3 | 2.1 | 1580 | 60 | 26.3 | good |
| 4 | 2.2 | 1620 | 62 | 26.1 | good |
| 5 | 2.4 | 1610 | 60 | 26.8 | good |
| 6 | 2.6 | 1520 | 61 | 24.9 | good |
| 7 | 2.8 | 1480 | 59 | 25.1 | bad |
| 8 | 3.0 | 1420 | 58 | 24.5 | bad |

According to Table 6, regardless of the pH of the composition, a high selectivity of 24.5 or higher is obtained. The meaning of 'bad' in the polishing particle stability is that polishing particles may sink (or precipitate), or the color of the polishing particles may be changed in the composition, thereby non-uniformly polishing a surface of the layers. Therefore, a preferable pH of the CMP composition of the experimental example 5-1 is about 2.1~2.6 in the condition of 0.5 wt. % of silica and 1.0 wt. % of perchloric acid.

Experimental Example 5-2

In the experimental example 5-2, polishing particle stabilities are examined by varying the pH of the CMP composition. First, silica having a grain size of about 60 nm is added in the composition with a concentration of about 0.5 wt. %, and potassium persulfate ($K_2S_2O_8$) is subsequently added as one of the oxidants with a concentration of about 0.3 wt. %, thereby forming 3 composition samples with a pH of about 4.2. pH regulators are subsequently added into 2 composition samples out of the total 3 composition samples, respectively, with a concentration less than 3 wt. %. In order to decrease pH, sulfuric acid is added as a pH regulator into one composition sample and the adding amount of the sulfuric acid is increased incrementally, by checking pH of the one composition sample and by macroscopically examining the polishing particle stability. When the pH of the CMP composition of the experimental example 5-2 is lower than 3.5, the polishing particle stability is poor. In order to increase pH, potassium hydroxide is added as a pH regulator into another composition sample and the adding amount of the potassium hydroxide is increased incrementally, by checking pH of the another composition sample and by macroscopically examining the polishing particle stability. When the pH of the CMP composition of the experimental example 5-2 is higher than 5.0, the polishing particle stability is poor. Therefore, a preferable pH of the CMP composition of the experimental example 5-2 is about 3.5-5.0 in the condition of 0.5 wt. % of silica and 0.3 wt. % of potassium persulfate.

Experimental Example 5-3

In the experimental example 5-3, polishing particle stabilities are examined by varying pH of the CMP composition. First, ceria having a grain size of about 60 nm is added in the composition with a concentration of about 0.5 wt. %, and ferric nitrate ($Fe(NO)_3$) is subsequently added as one of the oxidants with a concentration of about 0.3 wt. %, thereby forming 3 composition samples with a pH of about 2.1. Then, pH regulators are added into 2 composition samples out of the total 3 composition samples, respectively, with a concentration less than 3 wt. %. In order to decrease pH, nitric acid is added as a pH regulator into one composition sample and the adding amount of the sulfuric acid is increased incrementally, by checking pH of the one composition sample and by macroscopically examining the polishing particle stability. When the pH of the CMP composition of the experimental example 5-3 is lower than 2.0, the polishing particle stability is poor. In order to increase pH, potassium hydroxide is added as a pH regulator into another composition sample and the adding amount of the potassium hydroxide is increased incrementally, by checking pH of the another composition sample and by macroscopically examining the polishing particle stability. When the pH of the CMP composition of the experimental example 5-3 is higher than 2.8, the polishing particle stability is poor. Therefore, a preferable pH of the CMP composition of the experimental example 5-3 is about 2.0-2.8 in the condition of 0.5 wt. % of ceria and 0.3 wt. % of ferric nitrate.

Experimental Example 6

In the experimental example 6, polishing selectivities are examined by varying a grain size of silica. First, silica is added in the composition with a concentration of about 0.5 wt. %, and perchloric acid($HClO_4$) is subsequently added as one of the oxidants with a concentration of about 1.0 wt. %, thereby forming 4 composition samples. In an example embodiment, the grain sizes of silica in the 4 composition samples are 30 nm, 60 nm, 80 nm, and 120 nm, respectively. CMP processes are performed to organic layers and TEOS layers using the 4 CMP slurry composition samples, respectively. The following Table 7 shows experimental results measured after the CMP processes.

TABLE 7

| | Grain size (nm) of Silica | Polishing Rate (Å/min) Organic Layer (A) | TEOS (B) | Selectivity (A/B) |
|---|---|---|---|---|
| 1 | 30 | 1550 | 50 | 31 |
| 2 | 60 | 1620 | 62 | 26.1 |
| 3 | 80 | 2100 | 88 | 23.9 |
| 4 | 120 | 2430 | 101 | 24.1 |

According to Table 7, a high selectivity of 23.9 or higher is obtained when the grain size of silica is 120 nm or less.

Experimental Example 7

In the experimental example 7, polishing selectivities are examined by varying a grain size of ceria. First, ceria is added in the composition with a concentration of about 0.05 wt. %, and ferric nitrate is subsequently added as one of the oxidants with a concentration of about 3.0 wt. %, thereby forming 3 composition samples. In an example embodiment, the grain sizes of ceria in the 3 composition samples are 30 nm, 60 nm and 80 nm, respectively. CMP processes are performed to organic layers and TEOS layers using the 4 CMP slurry composition samples, respectively. The following Table 8 shows experimental results measured after the CMP processes.

TABLE 8

| | Grain size (nm) of Ceria | Polishing Rate (Å/min) Organic Layer (A) | TEOS (B) | Selectivity (A/B) |
|---|---|---|---|---|
| 1 | 30 | 1720 | 4 | 430 |
| 2 | 60 | 2100 | 6 | 350 |
| 3 | 80 | 2450 | 12 | 204 |

According to Table 8, high selectivities of 204-430 are obtained when the ceria is used as an oxide-polishing particle. Furthermore, selectivity is increased as the grain size of the ceria is decreased.

According to the afore-described several experimental examples, the CMP composition can be formed in such a way that an etch selectivity between the organic layer and the oxide layer is in a range of from about 6:1 to about 430:1. Thus, a CMP composition having an etch selectivity suitable for a desired semiconductor device can be used in the CMP process.

The CMP composition may be used in a process of fabricating a semiconductor device. An example of such processes will be described in more detail below.

FIGS. 3 through 10 are sectional views illustrating a process of fabricating a semiconductor device, according to example embodiments of the inventive concept.

Figure 3:
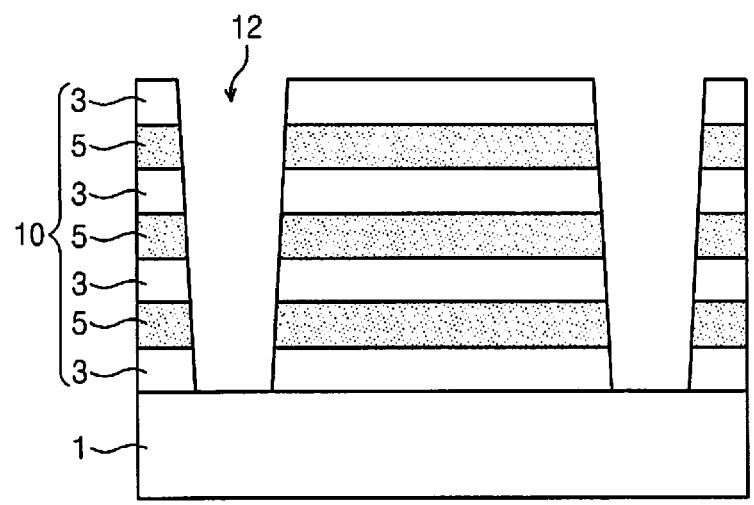
FIGS. 3 through 10 are sectional views illustrating a process of fabricating a semiconductor device, according to example embodiments.

Referring to FIG. 3, first gate interlayered insulating layers 3 and first sacrificial layers 5 may be alternatively stacked on a substrate 1 to form a first structure 10, according to at least one example embodiment. The first sacrificial layers 5 may be formed of a material having an etch selectivity with respect to the first gate interlayered insulating layers 3. In example embodiments, the first gate interlayered insulating layers 3 may be silicon oxide layers, and the first sacrificial layers 5 may be silicon nitride layers. The first sacrificial layers 5 and the first gate interlayered insulating layers 3 may be sequentially etched to form first holes 12, thus exposing the substrate 1.

Figure 4:
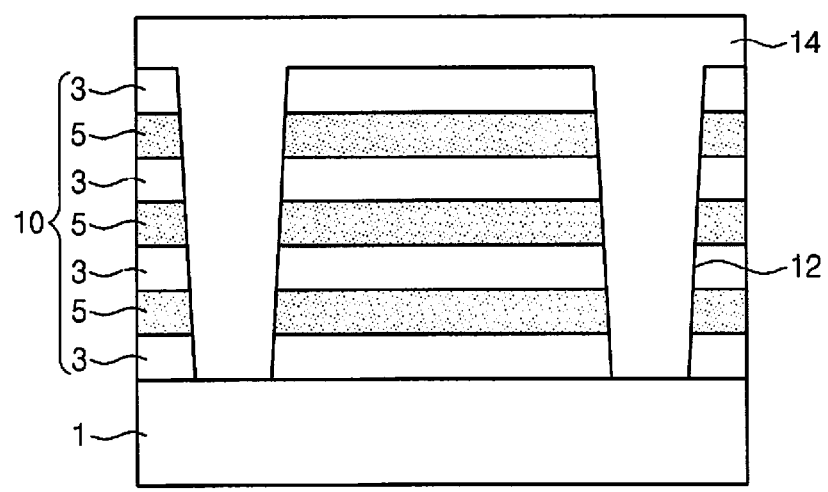

Referring to FIG. 4, a silicon-free organic layer 14 may be formed on the first structure 10 to fill the first holes 12, according to at least one example embodiment.

Figure 5:
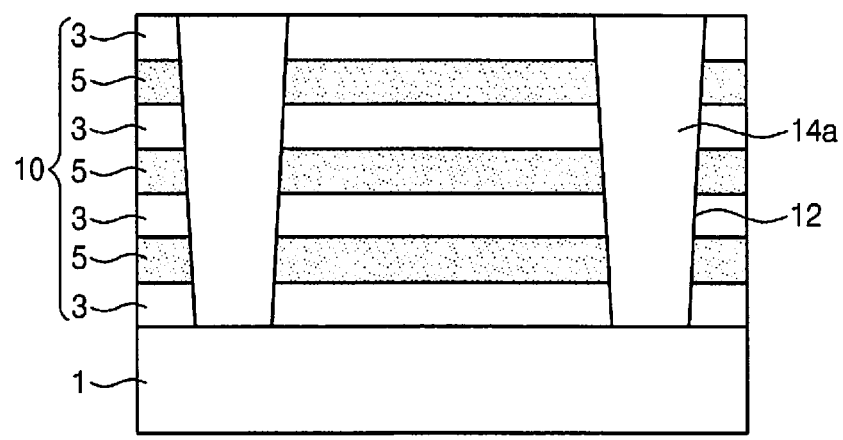

Referring to FIG. 5, a CMP process using the CMP composition may be performed on the organic layer 14 to remove the organic layer 14 from a top surface of the first structure 10 and expose the uppermost first gate interlayered insulating layer 3, according to at least one example embodiment. Because the use of the CMP composition makes it possible to rapidly polish the organic layer with a high polishing selectivity with respect to an oxide layer, the CMP process can be quickly performed without process failure. As the result of the CMP process, organic patterns 14a may remain in the first holes 12.

Figure 6:
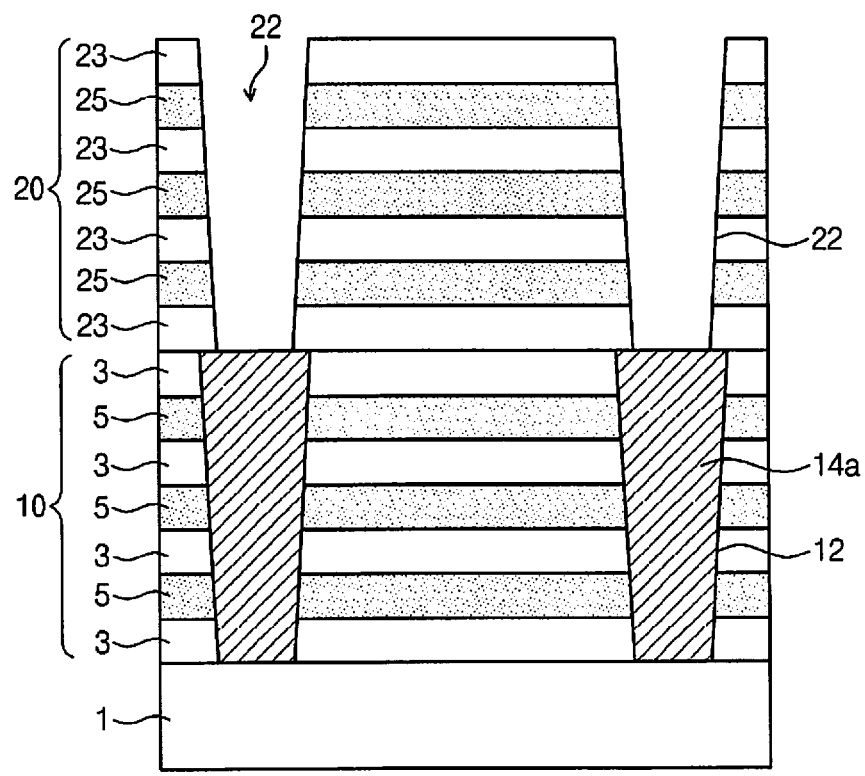

Referring to FIG. 6, second gate interlayered insulating layers 23 and second sacrificial layers 25 may be alternatively stacked on the first structure 10 to form a second structure 20, according to at least one example embodiment. The second sacrificial layers 25 may be formed of the same material as the first sacrificial layers 5. The second gate interlayered insulating layers 23 may be formed of the same material as the first gate interlayered insulating layers 3. The second sacrificial layers 25 and the second gate interlayered insulating layers 23 may be sequentially etched to form second holes 22 exposing the organic pattern 14a. The organic pattern 14a may make it possible to protect the first holes 12 and the substrate 1 thereunder.

Although two structures 10 and 20 are depicted in FIG. 6, the stacking number of the structures may be three or more, according to various example embodiments.

Figure 7:
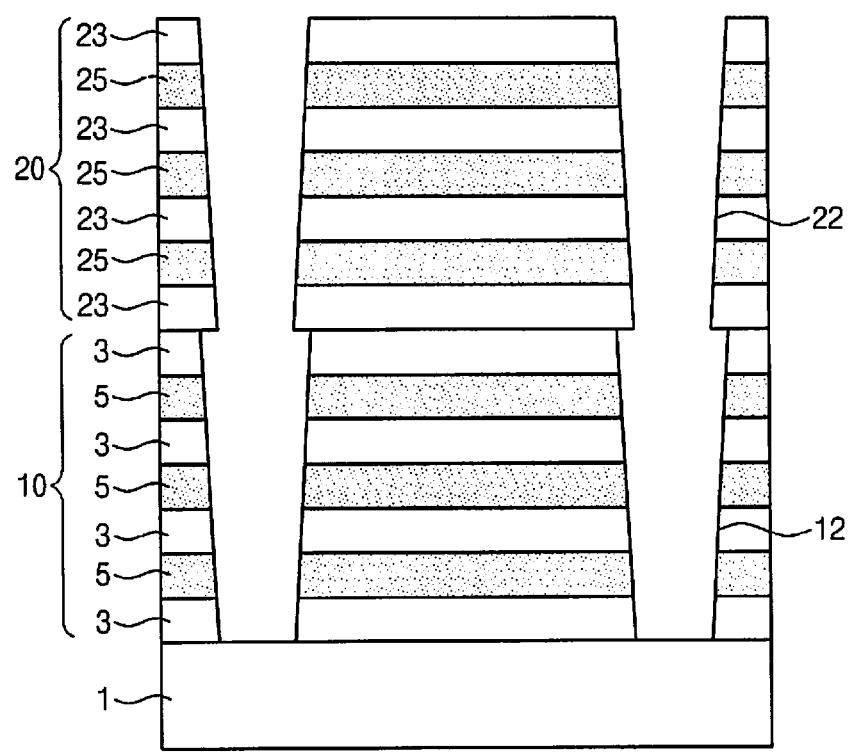

Referring to FIG. 7, an ashing process using oxygen may be performed to selectively remove the organic pattern 14a exposed by the second hole 22, according to at least one example embodiment. Accordingly, the substrate 1 may be partially exposed through the first holes 12.

Figure 8:
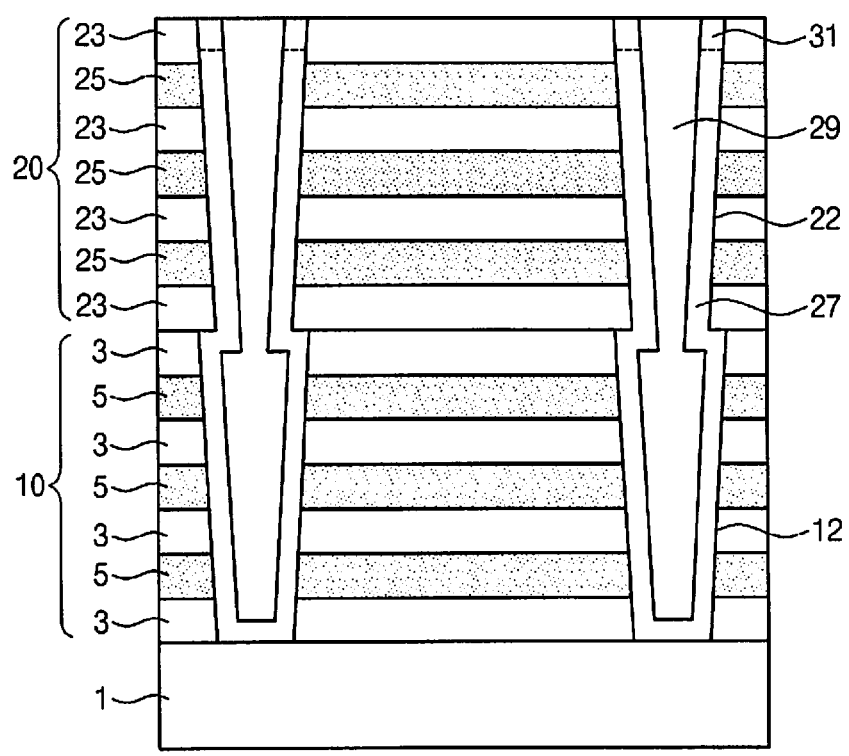

Referring to FIG. 8, a polysilicon layer may be conformally formed on the substrate 1, and a first insulating gapfill layer may be formed to fill the holes 12 and 22, according to at least one example embodiment. Thereafter, a planarization etching process may be performed to form active pillars 27 and first insulating gapfill patterns 29. The active pillars 27 may be formed in the holes 12 and 22 to cover the side and bottom surfaces thereof. The first insulating gapfill patterns 29 may be formed to fill the holes 12 and 22 after the active pillars 27 are formed. Thereafter, an ion implantation process may be performed to form drain regions 31 in upper portions of the active pillars 27.

Figure 9:
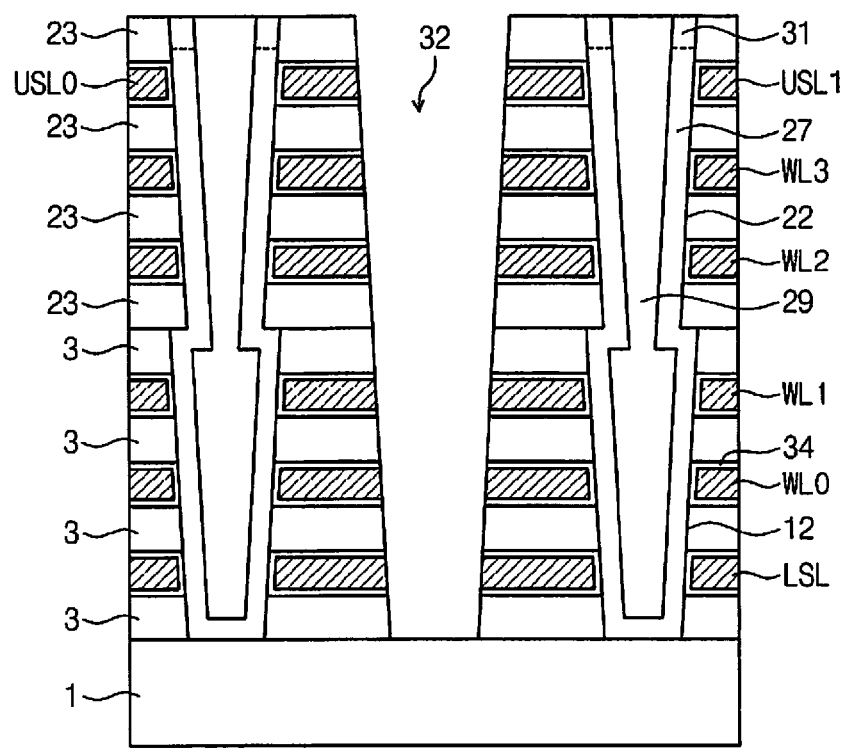

Referring to FIG. 9, the structures 20 and 10 may be patterned to form grooves 32 exposing the substrate 1, according to at least one example embodiment. The grooves 32 may be formed and spaced apart from the active pillars 27. The sacrificial layers 5 and 25 may be removed to form inter-layered empty regions. The grooves 32 may be used as paths for supplying etchant in the process of removing the sacrificial layers 5 and 25. A gate insulating layer 34 may be conformally formed in the inter-layered empty regions, and a conductive layer may be formed to fill the inter-layered empty regions and the groove 32. The gate insulating layer 34 may include a tunnel insulating layer, a charge-trap layer, and a blocking insulating layer. The conductive layer may be a doped polysilicon layer or a metal-containing layer. Next, the conductive layer may be removed from the groove 32 to expose the substrate 1. As a result, a lower selection line LSL, word lines WL0-WL3, and upper selection lines USL0 and USL1 may be formed in the inter-layered empty regions.

Figure 10:
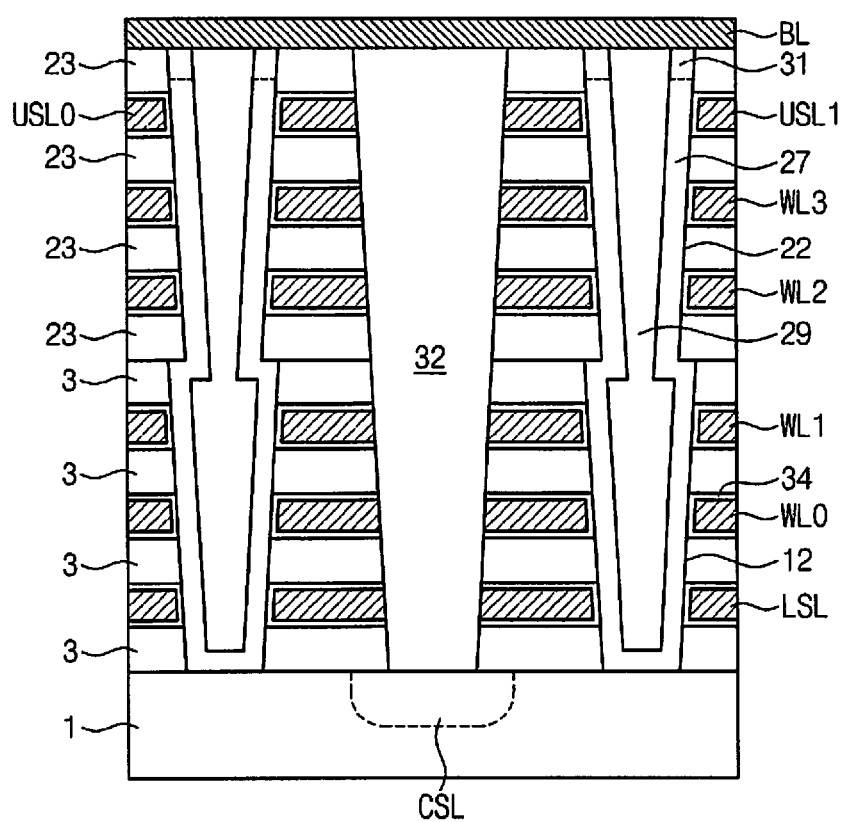

Referring to FIG. 10, an ion implantation process may be performed to form a common source line CSL below the groove 32, according to at least one example embodiment. A second insulating gapfill layer may be formed to fill the grooves 32, and then, be planarized to form second insulating gapfill patterns 34 remaining in the grooves 32. Thereafter, a plurality of bit lines BL may be formed on the second gate interlayered insulating layer 23. The bit lines BL may be connected to the drain region 31 and spaced apart from each other.

As described with reference to FIGS. 3 through 10, the CMP composition according to example embodiments may be used to fabricate 3D vertical NAND FLASH memory devices.

FIGS. 11 to 17 are sectional views illustrating a process of fabricating a semiconductor device, according to other example embodiments.

Figure 11:
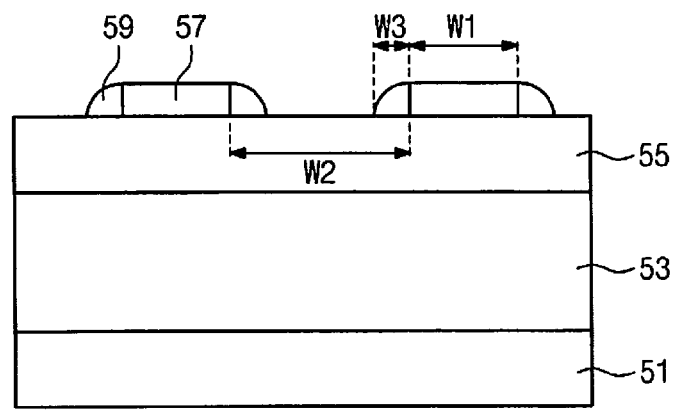
FIGS. 11 to 17 are sectional views illustrating a process of fabricating a semiconductor device, according to other example embodiments.

Referring to FIG. 11, an etch-target layer 53 may be formed on a substrate 51, according to at least one example embodiment. The etch-target layer 53 may be formed of or include, for example, a silicon oxide layer, a silicon nitride layer, or a polysilicon layer. A first mask layer 55 may be formed on the etch-target layer 53. The first mask layer 55 may be formed of a material (for example, a silicon-free organic material) having an etch selectivity with respect to the etch-target layer 53. A second mask pattern 57 may be formed on the first mask layer 55. The second mask pattern 57 may be formed of a material having an etch selectivity with respect to the first mask layer 55. The second mask pattern 57 may be formed to have a width W1. In example embodiments, the width W1 may be substantially equal to a minimum line width that can be obtained by a photolithography process. The second mask patterns 57 may be formed to have a space W2 that is larger than the width W1 of the second mask pattern 57. For example, a ratio of the width W1 to the space W2 may be about 3:5. Spacers 59 may be formed to cover sidewalls of the second mask pattern 57. Each of the spacers 59 may be formed to have a width W3 that may be equivalent to about one-third of the width W1 of the second mask pattern 57.

Figure 12:
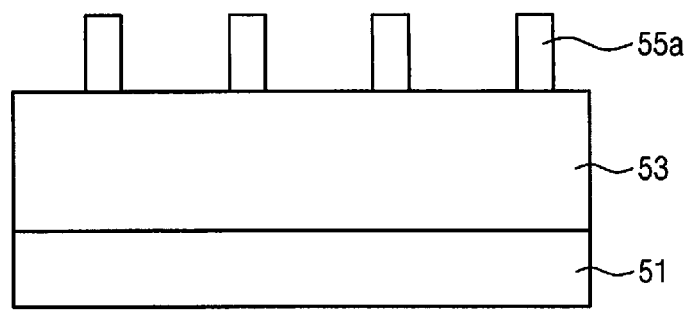

Referring to FIG. 12, the second mask pattern 57 may be removed, according to at least one example embodiment. The first mask layer 55 may be etched using the spacers 59 as an etch mask to form first mask patterns 55a. A space between the first mask patterns 55a may be substantially equivalent to the width W1 of the second mask pattern 57.

Figure 13:
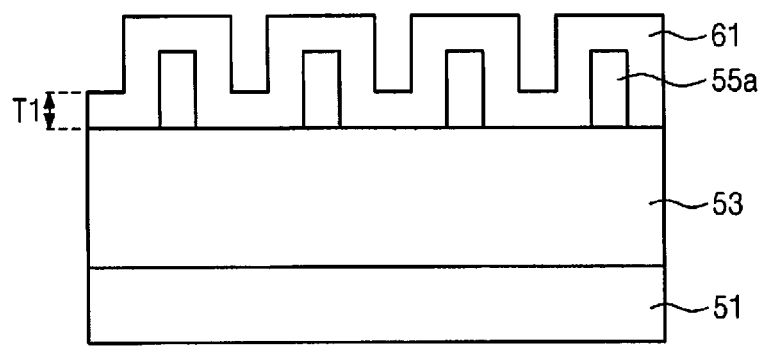

Referring to FIG. 13, a third mask layer 61 may be formed to cover conformally top and side surfaces of the first mask patterns 55, according to at least one example embodiment. The third mask layer 61 may be, for example, a silicon oxide layer. The third mask layer 61 may be formed to have a thickness T1 that is substantially equivalent to the width W3 of the spacer 59.

Figure 14:
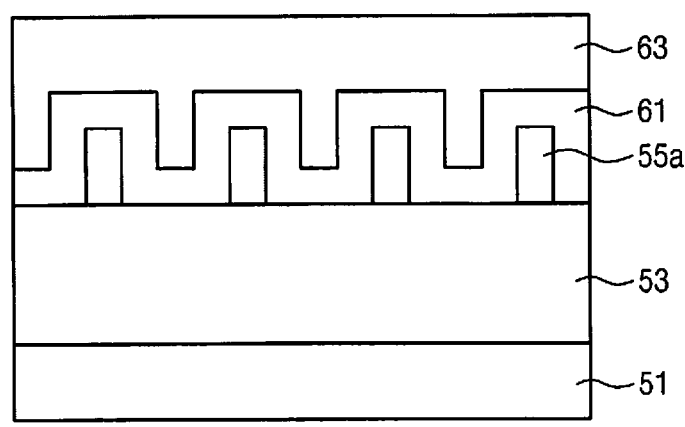

Referring to FIG. 14, an organic layer 63 may be formed on the third mask layer 61, according to at least one example embodiment. The organic layer 63 may include a silicon-free organic layer. The organic layer 63 may be formed to fill gaps between the first mask patterns 55a.

Figure 15:
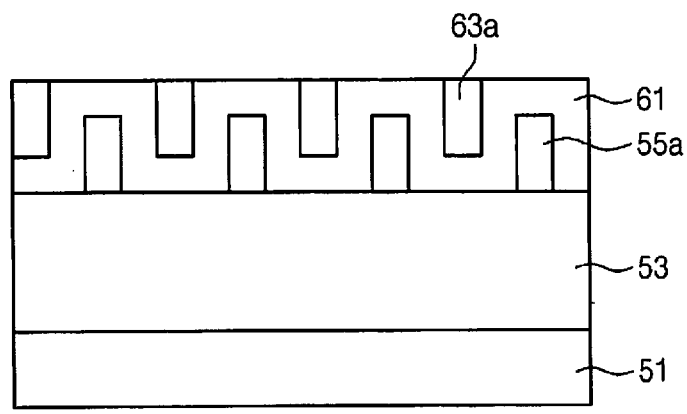

Referring to FIG. 15, a CMP process using the CMP composition may be performed on the organic layer 63 to remove the organic layer 63 from the uppermost surface of the third mask layer 61 and expose the uppermost surface of the third mask layer 61, according to at least one example embodiment. As a result, organic patterns 63a may be formed between the first mask patterns 55a.

Figure 16:
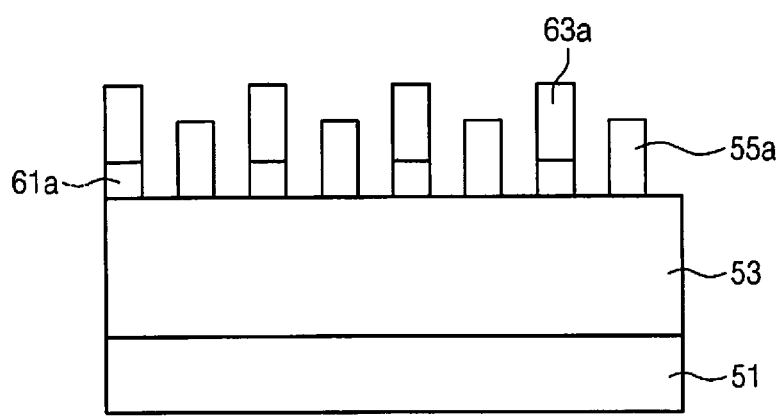

Referring to FIG. 16, an anisotropic etching process may be performed on the exposed third mask layer 61 to remove portions of the third mask layer 61 between the organic patterns 63a and expose the first mask patterns 55a, according to at least one example embodiment. As a result, third mask patterns 61a, which are remaining portions of the third mask layer 61, may remain below the organic patterns 63a. A space between the first mask pattern 55a and the organic pattern 63a may be substantially equal to the width W3 of the spacer 59.

Figure 17:
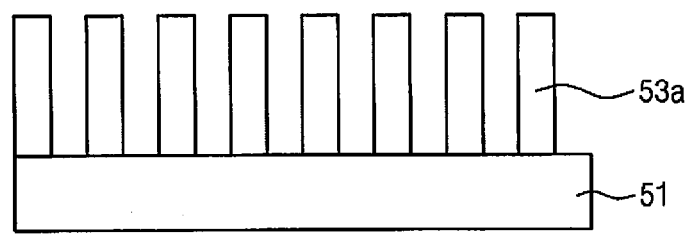

Referring to FIG. 17, the etch-target layer 53 may be etched using the first mask pattern 55a and the organic pattern 63a as an etch mask to form etch-target patterns 53a, according to at least one example embodiment. Thereafter, the first and third mask patterns 55a and 61a and the organic pattern 63a may be removed. Accordingly, the etch-target patterns 53a can have a line width that is smaller than the minimum line width that can be obtained by a photolithography process.

The method described with reference to FIGS. 11 through 17 may be applied to form word lines or bit lines of DRAM devices.

Figure 18:
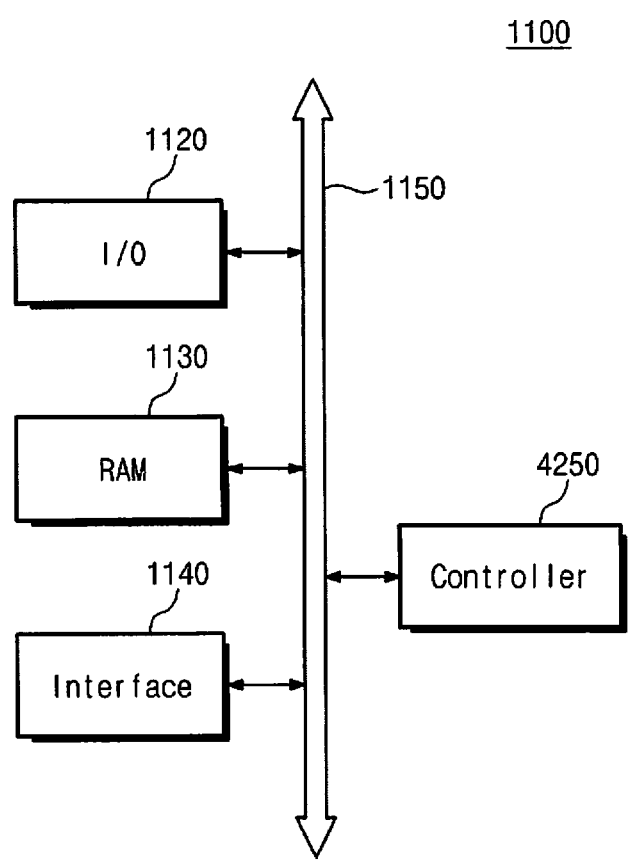
FIG. 18 is a schematic block diagram illustrating an example of memory systems including a semiconductor device fabricated by the process of example embodiments.

FIG. 18 is a schematic block diagram illustrating an example of memory systems including a semiconductor device fabricated by the process of example embodiments.

Referring to FIG. 18, a memory system 1100 may be applied to a PDA (personal digital assistant), a portable computer, a web tablet, a wireless phone, a mobile phone, a digital music player, a memory card and/or all the devices that can transmit and/or receive data in a wireless communication environment.

The memory system 1100 may include a controller 1110, an input/output device 1120 (e.g., a keypad and/or a display device), a memory 1130, an interface 1140 and a bus 1150. The memory 1130 and the interface 1140 may communicate with each other through the bus 1150.

The controller 1110 may include a microprocessor, a digital signal processor, a micro controller and/or other process devices similar to or the same as the microprocessor, the digital signal processor and the micro controller. The memory 1130 may be used to store an instruction executed by the controller 1110. The input/output device 1120 may receive data and/or a signal from the outside of the system 1100 and/or transmit data and/or a signal to the outside of the system 1100. For example, the input/output device 1120 may include a keyboard, a keypad and/or a displayer.

The memory 1130 may include the nonvolatile memory device according to example embodiments of the inventive concept. The memory 1130 may further include a different type of memory, a volatile memory device capable of random access and various types of memories.

The interface 1140 may transmit data to a communication network and/or may receive data from a communication network.

Figure 19:
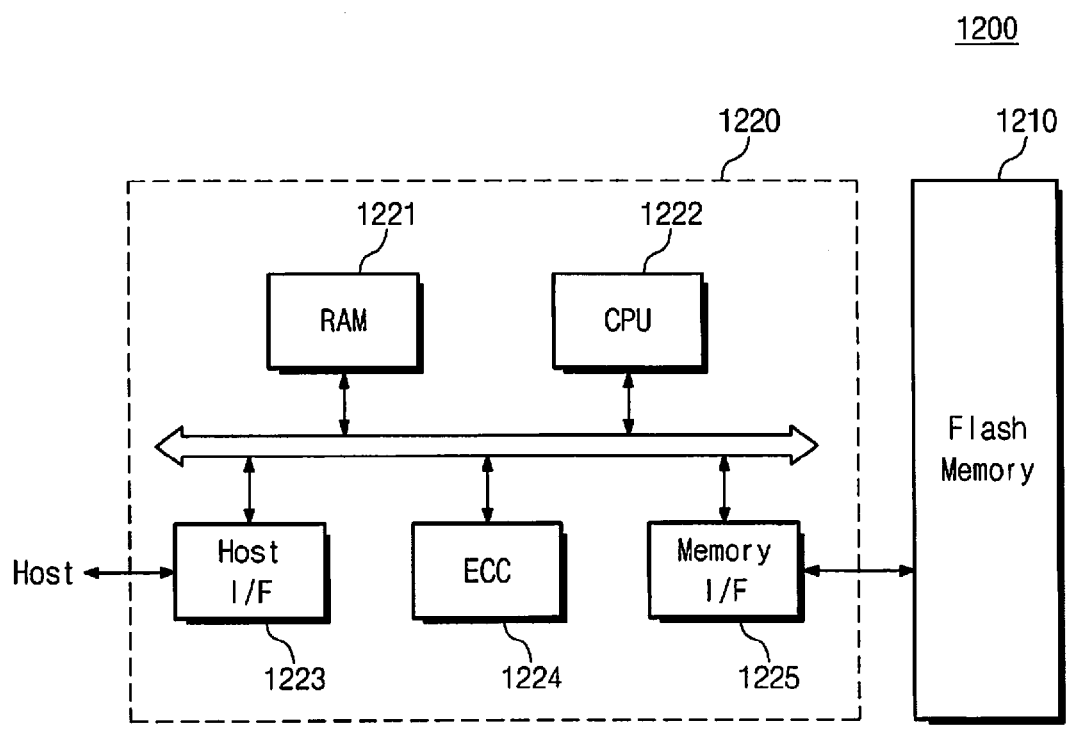
FIG. 19 is a schematic block diagram illustrating an example of memory cards including a semiconductor device fabricated by the process of example embodiments.

FIG. 19 is a schematic block diagram illustrating an example of memory cards including a semiconductor device fabricated by the process of example embodiments.

Referring to FIG. 19, a memory card 1200 for supporting a storage capability of a large capacity may be fitted with a semiconductor memory device 1210 according to example embodiments of the inventive concept. The memory card 1200 according to example embodiments of the inventive concept may include a memory controller 1220 that may control every data exchange between a host and the semiconductor memory device 1210.

Figure 20:
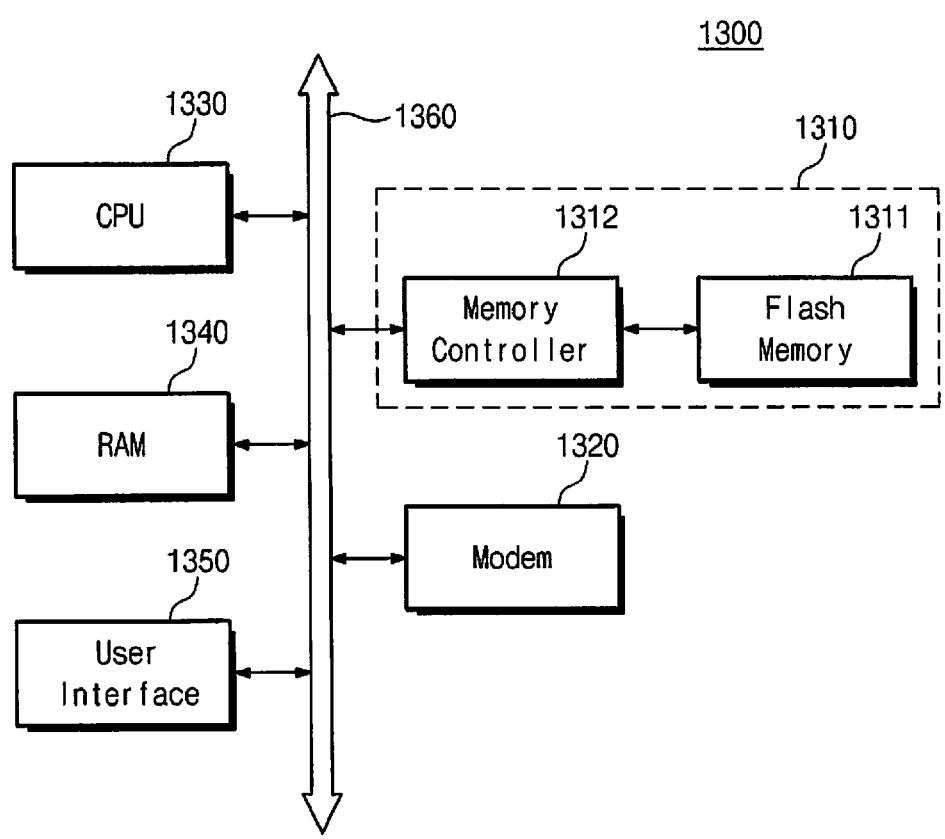
FIG. 20 is a schematic block diagram illustrating an example of information processing systems including a semiconductor device fabricated by the process of example embodiments.

A static random access memory (SRAM) 1221 may be used as an operation memory of a processing unit 1222. A host interface 1223 may include data exchange protocols of a host that may be connected to the memory card 1200. An error correction block 1224 may detect and/or may correct errors that may be included in data readout from a multi bit semiconductor memory device 1210. A memory interface 1225 may interface with the semiconductor memory device 1210 of at least some example embodiments. The processing unit 1222 may perform every control operation for exchanging data of the memory controller 1220. Even though not depicted in drawings, it may be apparent to one of ordinary skill in the art that the memory card 1200 according to example embodiments of the inventive concept may include a ROM (not illustrated) storing code data for interfacing with the host. FIG. 20 is a schematic block diagram illustrating an example of information processing systems including a semiconductor device fabricated by the process of example embodiments.

Referring to FIG. 20, an information processing system 1300 may include a 3D semiconductor memory system 1310 including a 3D semiconductor memory device according to example embodiments of the inventive concept. The semiconductor memory system 1310 may be mounted to an information processing system, for example, a mobile device and/or a desktop computer. The information processing system 1300 may also include a modem 1320, a central processing unit (CPU) 1330, a RAM 1340, and a user interface 1350, that may be electrically connected to a system bus 1360. The semiconductor memory system 1310 may be configured similarly to that described with respect to FIG. 20, and may include a 3D semiconductor memory device 1311, and a memory controller 1312. A memory system 1310 may be a solid state drive SSD, and data that may be processed by the CPU 1330 and/or input from the outside may be stored in the SSD. The information processing system 1300 configured as described and including a 3D semiconductor memory device may reliably store a large amount of data in the semiconductor memory system 1310. The semiconductor memory system 1310 may conserve resources for error correction and a high speed data exchange function may be provided. Although not illustrated in the drawing, it may be apparent to those of ordinary skill in the art that the information processing system 1300 may also include an application chipset, a camera image processor (CIS) and/or an input/output device.

Furthermore, a semiconductor memory device and/or memory system that may include the same may be packaged in various types of ways. For instance, the semiconductor memory device and/or memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

According to example embodiments, the use of the CMP slurry composition allows a silicon-free organic layer to be polished with selectivity higher than 6:1 with respect to an oxide layer. For example, when a polishing process is performed using the CMP slurry composition, it is possible to obtain an etch selectivity, which is a ratio in etch rate of the organic layer with respect to the oxide layer, ranging from about 6:1 to about 430:1. Thus, a CMP composition having an etch selectivity suitable for a desired semiconductor device can be used in the CMP process. Further, the use of the CMP slurry composition may not result in a process failure, such as peeling of delamination. Accordingly, it is possible to fabricate semiconductor devices without the process failure.

While example embodiments have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   forming a first structure having a first recess region, on a substrate;
   forming an organic layer on the first structure to fill the first recess region; and
   performing a chemical mechanical polishing (CMP) process on the organic layer to remove at least one portion of the organic layer using a CMP slurry composition, the CMP slurry composition comprising:
   from about 0.001% to about 5% by weight of oxide-polishing particles;
   from about 0.1% to about 5% by weight of an oxidant;
   from 0% to about 5% by weight of a polishing regulator;
   from 0% to about 3% by weight of a surfactant;
   from 0% to about 3% by weight of a pH regulator; and
   from about 79% to about 99.889% by weight of deionized water,
   wherein the first structure includes a top portion made of an oxide layer, and
   wherein a ratio of an etch rate of the CMP slurry composition for the organic layer over the etch rate for the oxide layer is in a range between 6:1 and 430:1.

2. The method of claim 1, wherein the removing of the at least one portion of the organic layer comprises exposing a top surface of the first structure.

3. The method of claim 2, wherein the first recess region is formed to include a first hole exposing the substrate, and the method further comprises:
   forming a second structure including a second hole exposing a top surface of the organic layer, on the first structure, after performing the CMP process on the organic layer;
   removing the organic layer through the second hole;

forming an active pillar covering at least sidewalls of the first and second holes; and forming a conductive line in the first and second structures.

4. The method of claim 3, wherein:

each of the first and second structures includes a plurality of insulating layers and a plurality of sacrificial layers alternatively stacked on the substrate, and the forming of the conductive line in the first and second structures comprises:

selectively removing at least one of the sacrificial layers to form at least one inter-layered empty region; and forming the conductive line in the at least one inter-layered empty region.

5. The method of claim 2, wherein:

the first structure comprises an etch-target layer provided on the substrate, a plurality of line-shaped first mask patterns provided parallel to each other on the etch-target layer, and a second mask layer conformally covering side and top surfaces of the first mask patterns, the second mask layer has the first recess region between the first mask patterns, and the exposing of the top surface of the first structure exposes a top surface of the second mask layer.

6. The method of claim 5, wherein:

a space between the first mask patterns is about three times a thickness of the second mask layer, and the organic layer is disposed between the first mask patterns.

7. The method of claim 5, further comprising an anisotropic etching process to remove the exposed second mask layer and form a second mask pattern below the organic layer.

* * * * *